(12) United States Patent
Wu et al.

(10) Patent No.: US 12,328,957 B2
(45) Date of Patent: Jun. 10, 2025

(54) SENSING DEVICE AND MANUFACTURING METHOD THEREOF

(71) Applicant: InnoCare Optoelectronics Corporation, Tainan (TW)

(72) Inventors: Chih-Hao Wu, Tainan (TW); Jyun-Hao Syu, Tainan (TW)

(73) Assignee: InnoCare Optoelectronics Corporation, Tainan (TW)

( * ) Notice: Subject to any disclaimer, the term of this patent is extended or adjusted under 35 U.S.C. 154(b) by 393 days.

(21) Appl. No.: 17/882,616

(22) Filed: Aug. 8, 2022

(65) Prior Publication Data

US 2023/0067176 A1 Mar. 2, 2023

(30) Foreign Application Priority Data

Sep. 2, 2021 (CN) .......................... 202111024635.1

(51) Int. Cl.
*H10F 39/12* (2025.01)
*H10F 39/00* (2025.01)
*H10F 39/18* (2025.01)

(52) U.S. Cl.
CPC ....... *H10F 39/1892* (2025.01); *H10F 39/016* (2025.01); *H10F 39/195* (2025.01)

(58) Field of Classification Search
CPC ......... H01L 27/14659; H01L 27/14676; H01L 27/14692; H10F 39/016; H10F 39/1892; H10F 39/195
See application file for complete search history.

(56) References Cited

U.S. PATENT DOCUMENTS

2009/0218650 A1* 9/2009 Lee .................... H01L 27/14632
257/458
2020/0321386 A1* 10/2020 Manda .............. H01L 27/14685

FOREIGN PATENT DOCUMENTS

| CN | 102096089 | 6/2011 | |
| GB | 2570401 | 7/2019 | |
| WO | WO-2016195000 A1 * | 12/2016 | ........... H01L 27/146 |
| WO | WO-2021171914 A1 * | 9/2021 | ........... G01T 1/2018 |

OTHER PUBLICATIONS

English translation of WO 2016/195000 A1 (Year: 2016).*

* cited by examiner

*Primary Examiner* — Mark R Gaworecki
(74) *Attorney, Agent, or Firm* — JCIPRNET

(57) ABSTRACT

Provided are a sensing device and a manufacturing method thereof. The sensing device includes a substrate, a first electrode and a sensing layer. The first electrode is disposed on the substrate. The sensing layer is disposed on the first electrode and has a first surface adjacent to the first electrode. The first electrode has a length smaller than that of the first surface. The manufacturing method of the sensing device includes the following. A substrate is provided. A sensing layer is formed on the substrate. A first electrode is formed on the substrate so that the first electrode is disposed between the sensing layer and the substrate. The sensing layer has a first surface adjacent to the first electrode. The first electrode has a length smaller than that of the first surface of the sensing layer.

17 Claims, 13 Drawing Sheets

SENSING DEVICE AND MANUFACTURING METHOD THEREOF

CROSS-REFERENCE TO RELATED APPLICATION

This application claims the priority benefit of China application serial no. 202111024635.1, filed on Sep. 2, 2021. The entirety of the above-mentioned patent application is hereby incorporated by reference herein and made a part of this specification.

BACKGROUND

Technical Field

The disclosure relates to a sensing device and a manufacturing method thereof, and more particularly to a sensing device capable of reducing parasitic capacitance or reducing electronic noise and a manufacturing method thereof.

Related Art

A sensing device (such as an X-ray sensor) may be applied in imaging for medical inspection and/or nondestructive industrial inspection. By using high penetration characteristics of X-rays, the X-ray sensor is able to perform inspection without destroying an object under inspection, and is thus widely used in biological inspection of humans, airport security inspection of baggage or passengers and the like. Also, quality requirements of the sensing device are increasing.

SUMMARY

The disclosure provides a sensing device and a manufacturing method thereof, in which parasitic capacitance can be reduced or electronic noise can be reduced.

According to an embodiment of the disclosure, a sensing device includes a substrate, a first electrode and a sensing layer. The first electrode is disposed on the substrate. The sensing layer is disposed on the first electrode and has a first surface adjacent to the first electrode. The first electrode has a length smaller than that of the first surface.

According to an embodiment of the disclosure, a manufacturing method of a sensing device includes the following. A substrate is provided. A sensing layer is formed on the substrate. A first electrode is formed on the substrate so that the first electrode is disposed between the sensing layer and the substrate. The sensing layer has a first surface adjacent to the first electrode. The first electrode has a length smaller than that of the first surface of the sensing layer.

BRIEF DESCRIPTION OF THE DRAWINGS

The accompanying drawings, which are included to provide a further understanding of the disclosure, are incorporated in and constitute a part of this specification. The drawings illustrate embodiments of the disclosure and, together with the description, serve to explain the principles of the disclosure.

DESCRIPTION OF THE EMBODIMENTS

Figure 1A:
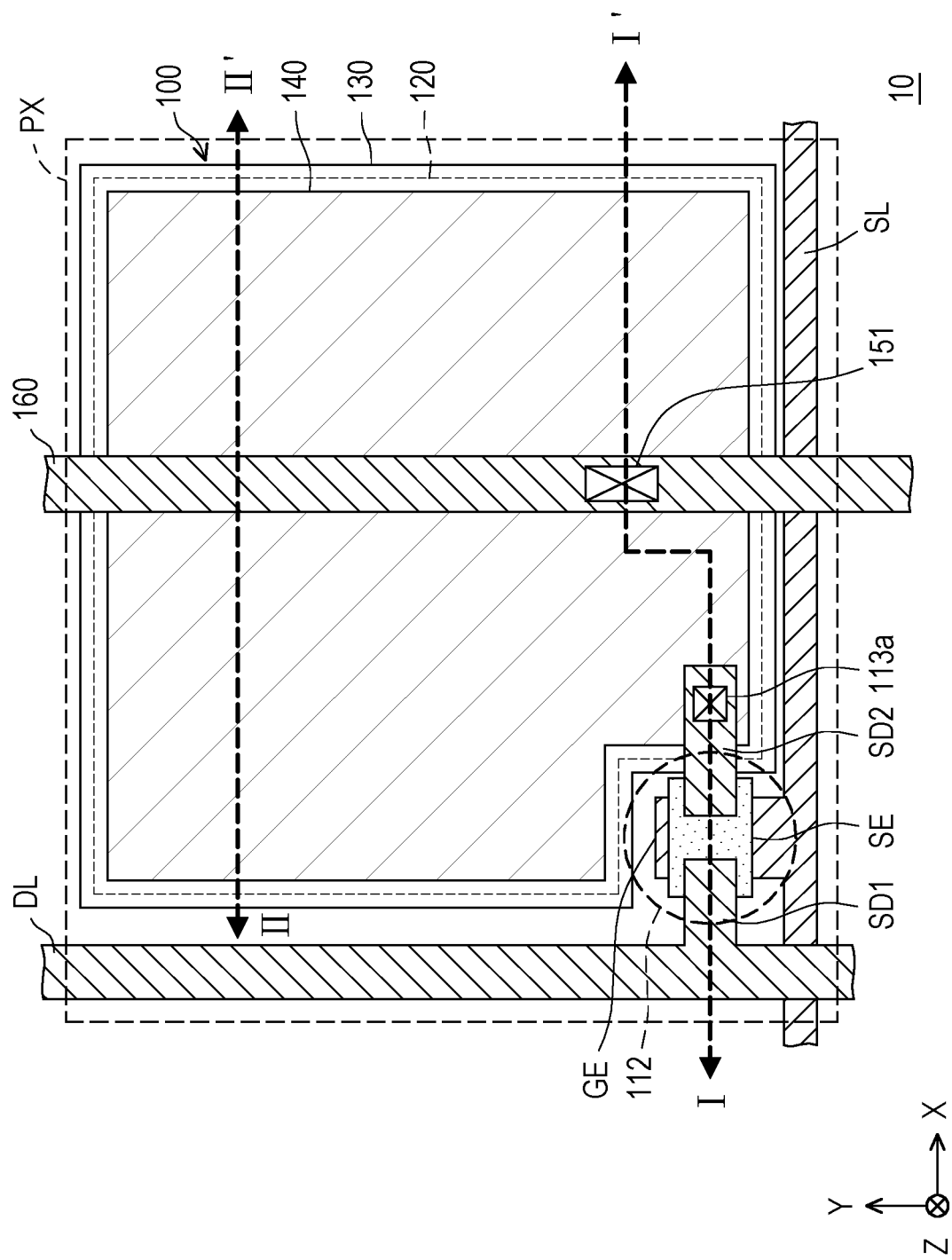
FIG. 1A is a schematic top view of a sensing device according to an embodiment of the disclosure.

The disclosure will be understood by reference to the following detailed description when considered in connection with the accompanying drawings. It is to be noted that, for ease of understanding and simplicity of the drawings, some of the drawings of the disclosure only illustrate a part of an electronic device, and specific components in the drawings are not drawn according to actual scale. In addition, the number and size of each component in the drawings are only for schematic purposes and are not intended to limit the scope of the disclosure.

In the following description and claims, the terms such as "include" and "comprise" are used in an open-ended fashion, and thus should be interpreted to mean "include, but not limited to . . . ".

It will be understood that when a component or layer is referred to as being "on" or "connected to" another component or layer, it may be directly on or directly connected to the another component or layer, or an intervening component or layer may be present between the two (indirect case). In contrast, when a component or layer is referred to as being "directly on" or "directly connected to" another component or layer, there is no intervening component or layer between the two.

Although terms such as "first", "second", "third" and the like may be used to describe various components, the components are not limited to these terms. These terms are used only to distinguish one component from another in the specification. The same terms are not necessarily used in the claims as in the description and may be replaced with first, second, third and the like according to the order in which the components are stated in the claims. Therefore, a first component in the following description may be a second component in the claims.

Terms such as "about", "approximately", "substantially" and "roughly" as used herein usually mean within 10%, 5%, 3%, 2%, 1%, or 0.5% of a given value or range. Every quantity given herein is an approximate quantity, that is, the meanings of the terms such "about", "approximately", "substantially" and "roughly" are implied even if the terms are not specifically used. Expressions such as "range of a first value to a second value" and "range of between a first value and a second value" mean that the range includes the first value, the second value, and other values therebetween.

In some embodiments of the disclosure, unless specifically defined, terms regarding bonding and connection, such as "connected" and "interconnected", may mean that two structures are in direct contact, or are not in direct contact and have other structures disposed therebetween. The terms regarding bonding and connection may also include a case where both structures are movable or both structures are fixed. In addition, the term "coupled" includes any direct and indirect electrical connection means.

A sensing device of the disclosure may be applied to an X-ray sensor or a fingerprint reader, but is not limited thereto. In addition, the sensing device may include a bendable or flexible sensing device. The outer shape of the sensing device may be a rectangular shape, a circular shape, a polygonal shape, a shape with curved edges, or any other suitable shape. The sensing device may include a peripheral system such as a driving system, a control system, or a shelf system to support the X-ray sensor or the fingerprint reader. The disclosure will be described below by way of a sensing device. However, the disclosure is not limited thereto.

It will be understood that the features of different embodiments described below may be disassembled, replaced, recombined, or mixed to complete other embodiments without departing from the spirit of the disclosure. The features of the embodiments may be arbitrarily mixed or combined as long as they do not violate the spirit of the disclosure or conflict.

Reference will now be made in detail to the exemplary embodiments of the disclosure, examples of which are illustrated in the accompanying drawings. Wherever possible, the same reference numerals are used in the drawings and the description to refer to the same or like portions.

Figure 1B:
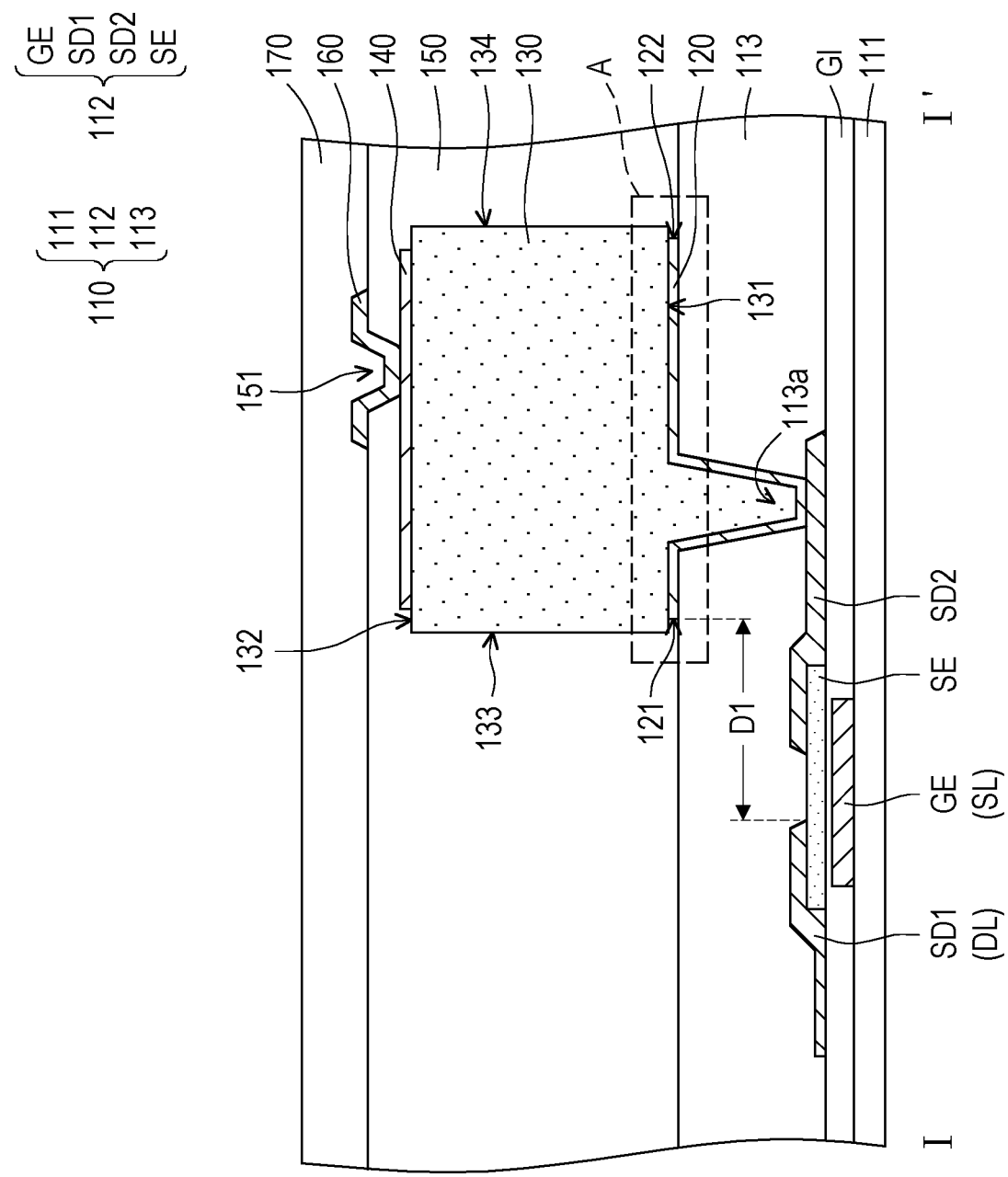
FIG. 1B is a schematic cross-sectional view of the sensing device of FIG. 1A along section line I-I'.
Figure 1C:
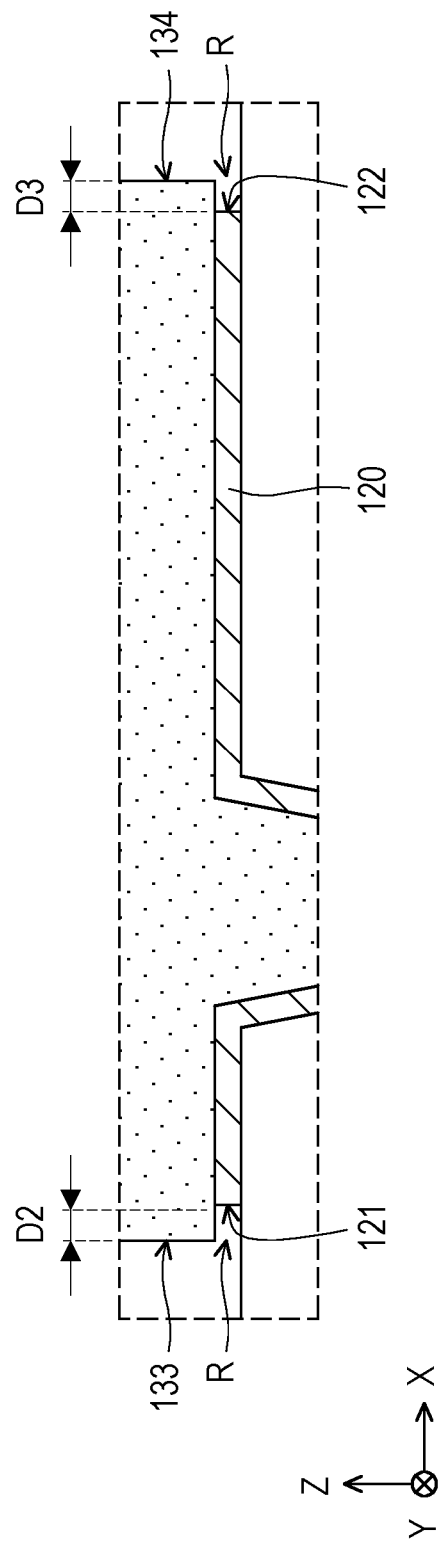
FIG. 1C is an enlarged schematic view of area A in FIG. 1B.
Figure 1D:
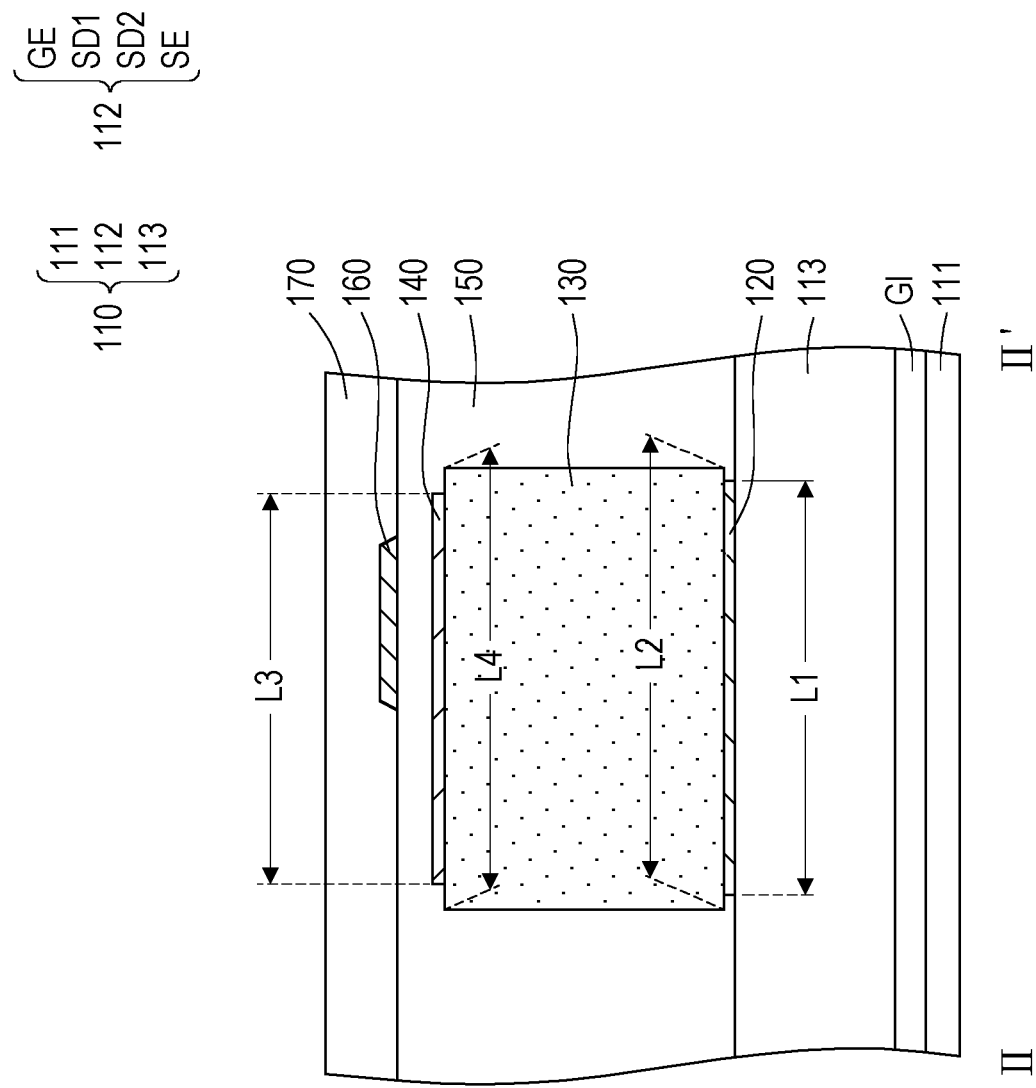
FIG. 1D is a schematic cross-sectional view of the sensing device of FIG. 1A along section line II-II'.
Figure 2:
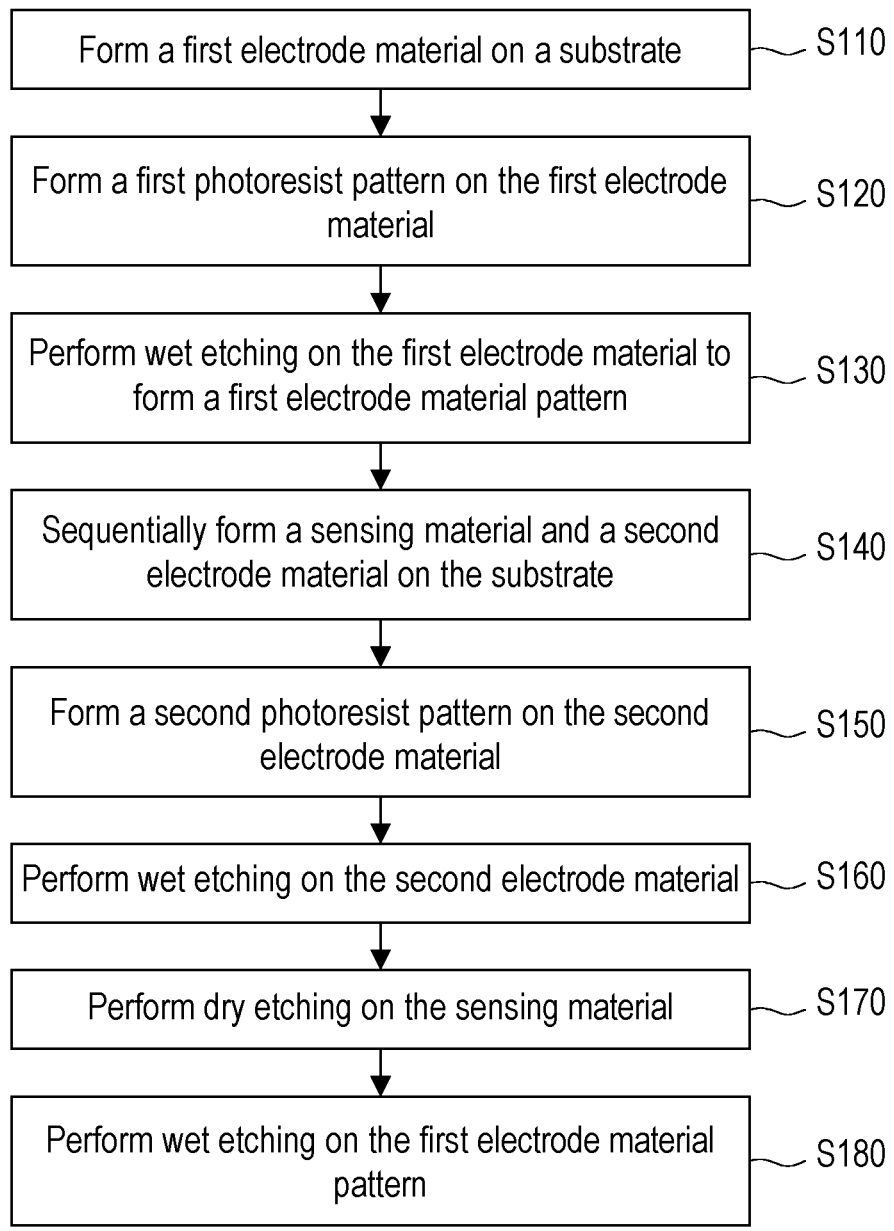
FIG. 2 is a flowchart of a manufacturing method of a sensing device according to an embodiment of the disclosure.

FIG. 1A is a schematic top view of a sensing device according to an embodiment of the disclosure. FIG. 1B is a schematic cross-sectional view of the sensing device of FIG. 1A along section line I-I'. FIG. 1C is an enlarged schematic view of area A in FIG. 1B. FIG. 1D is a schematic cross-sectional view of the sensing device of FIG. 1A along section line II-II'. FIG. 2 is a flowchart of a manufacturing method of a sensing device according to an embodiment of the disclosure. FIG. 3A to FIG. 3F are schematic cross-sectional views of a manufacturing method of a sensing device according to an embodiment of the disclosure. For clarity and ease of illustration, some components in the sensing device are omitted in FIG. 1A and FIG. 3A to FIG. 3F. A sensing device 10 may be, for example but not limited to, an X-ray sensor.

Referring to FIG. 1A and FIG. 1B, the sensing device 10 of the present embodiment includes a substrate 110 and multiple sensing pixels PX. Each sensing pixel PX includes at least one sensing unit 100. The sensing unit 100 includes a first electrode 120, a sensing layer 130, and a second electrode 140. The substrate 110 includes a base 111, a scan line SL, a data line DL, a transistor 112, and an insulating layer 113. In the present embodiment, the base 111 may include a hard substrate, a soft substrate, or a combination of the foregoing. Examples of a material of the base 111 may include but not limited to glass, quartz, sapphire, ceramics, polycarbonate (PC), polyimide (PI), polyethylene terephthalate (PET), any other suitable material, or a combination of the foregoing.

In the present embodiment, the transistor 112 is disposed on the base 111. The transistor 112 includes but not limited to a gate GE, a source SD1, a drain SD2, and a semiconductor SE. The gate GE is disposed on the base 111. Taking a bottom-gate type transistor as an example, a gate insulating layer GI is disposed on the gate GE to cover the gate GE. The semiconductor SE is disposed on the gate insulating layer GI and is disposed corresponding to the gate GE. The source SD1 and the drain SD2 are respectively disposed on the gate insulating layer GI, and the source SD1 and the drain SD2 are respectively coupled to the semiconductor SE. In the present embodiment, a material of the semiconductor SE may include but not limited to amorphous silicon, low temperature poly-silicon (LTPS), oxide semiconductor such as indium gallium zinc oxide (IGZO), any other suitable material, or a combination of the foregoing. In some embodiments, the transistor 112 may be a top-gate type transistor, a double-gate type transistor, or any other suitable transistor.

In the present embodiment, the scan line SL is disposed on the base 111 and is coupled to the gate GE of the transistor 112. The data line DL is disposed on the base 111 and is coupled to the source SD1 of the transistor 112. However, the disclosure is not limited thereto. An area between two adjacent scan lines SL and two adjacent data lines DL defines the sensing pixel PX.

In the present embodiment, a first direction X, a second direction Y, and a third direction Z are respectively different directions. For example, the first direction X is an extension direction of the scan line SL, the second direction Y is an extension direction of the data line DL, and the third direction Z is the normal direction of the base 111. The first direction X is substantially perpendicular to the second direction Y, and the first direction X and the second direction Y are respectively substantially perpendicular to the third direction Z. However, the disclosure is not limited thereto.

In the present embodiment, the insulating layer 113 is disposed on the gate insulating layer GI to cover the source SD1, the drain SD2, and the semiconductor SE. The insulating layer 113 has an opening 113a to expose part of the drain SD2. The insulating layer 113 may have a single-layer or multi-layer structure, and may include, for example but not limited to, an organic material, an inorganic material (such as silicon nitride, silicon oxide, or silicon oxynitride), or a combination of the foregoing.

In the present embodiment, the first electrode 120 is disposed on the insulating layer 113 of the substrate 110. The first electrode 120 may also be disposed in the opening 113a of the insulating layer 113 so as to be coupled to the drain SD2. In a section along a direction, the first electrode 120 may have a length. Taking FIG. 1D as an example, the first electrode 120 has a length L1. The length L1 is, for example, a maximum length of the first electrode 120 as measured along the first direction X. Referring also to FIG. 1C, the first electrode 120 has a side edge 121 and a side edge 122 opposite each other, and the side edge 121 is closer to the transistor 112 than the side edge 122. As shown in FIG. 1B, in the first direction X, a distance D1 is provided between the source SD1 (or data line DL) and the first electrode 120. The distance D1 is, for example, a shortest distance between the source SD1 and the side edge 121 of the first electrode 120 in the first direction X. A material of the first electrode 120 may include a transparent conductive material or a non-transparent conductive material. Examples thereof include but not limited to indium gallium zinc oxide (IGZO), indium tin oxide (ITO), indium zinc oxide (IZO), indium oxide, zinc oxide, tin oxide, a metal material (such as aluminum, molybdenum, copper, titanium, or silver), any other suitable material, or a combination of the foregoing.

In the present embodiment, the sensing layer 130 is disposed on the first electrode 120 so as to be coupled to the first electrode 120. The sensing layer 130 may be a photoelectric semiconductor, detecting the number of photons of incident light, generating an electrical signal, and sending the electrical signal through the transistor 112. The sensing layer 130 may include a laminated structure including an N-type semiconductor, an intrinsic semiconductor, and a P-type semiconductor. However, the disclosure is not limited thereto. In the present embodiment, the sensing layer 130 has a first surface 131 adjacent to the first electrode 120, a second surface 132 opposite the first surface 131, and a first side edge 133 and a second side edge 134 opposite each other. The first side edge 133 is closer to the transistor 112 than the second side edge 134. In the present embodiment, as shown in FIG. 1B and FIG. 1C, in the first direction X, a distance D2 is provided between the first side edge 133 and the side edge 121 of the first electrode 120, and a distance D3 is provided between the second side edge 134 and the side edge 122 of the first electrode 120. The distance D2 and the distance D3 are, for example, between 0.1 micrometer (μm) and 5 μm. However, the disclosure is not limited thereto. In the present embodiment, a recess R may be defined by the sensing layer 130, the first electrode 120, and the substrate 110. Two side edges of the recess R may respectively be the first surface 131 of the sensing layer 130 and a surface of the substrate 110 facing the sensing layer 130, and a bottom surface of the recess R may be the side edge 121 or the side edge 122 of the first electrode 120.

As shown in FIG. 1D, the first surface 131 of the sensing layer 130 has a length L2, and the second surface 132 of the sensing layer 130 has a length L4. The length L2 is, for example, a maximum length of the first surface 131 of the sensing layer 130 as measured along the first direction X. In some embodiments, the length L2 of the first surface 131 is greater than the length L4 of the second surface 132. In the present embodiment, the length L1 of the first electrode 120 is, for example, smaller than the length L2 of the first surface 131 of the sensing layer 130. A difference between the length L1 of the first electrode 120 and the length L2 of the first surface 131 of the sensing layer 130 is, for example, between 0.1 μm and 10 μm. However, the disclosure is not limited thereto. In a schematic top view of the present embodiment (as shown in FIG. 1A), the area of the sensing layer 130 is greater than the area of the first electrode 120. In a schematic cross-sectional view of the present embodiment (as shown in FIG. 1B), an orthographic projection of the sensing layer 130 in the third direction Z is larger than an orthographic projection of the first electrode 120 in the third direction Z on the base 111.

Therefore, in the present embodiment, by making the length L1 of the first electrode 120 smaller than the length L2 of the first surface 131 of the sensing layer 130, the area of the sensing layer 130 of the sensing device 10 of the present embodiment is greater than the area of the first electrode 120, so as to increase the fill factor (that is, a ratio of the area of the sensing layer 130 to the area of the sensing pixel PX) and improve sensing sensitivity. Moreover, the distance D1 is provided between the first electrode 120 and the source SD1 (or data line DL), a distance is provided between the first electrode 120 and the scan line SL, and parasitic capacitance can be reduced or electronic noise can be reduced.

In the present embodiment, the second electrode 140 is disposed on the sensing layer 130 so as to be coupled to the sensing layer 130. As shown in FIG. 1D, the second electrode 140 has a length L3. The length L3 is, for example, a maximum length of the second electrode 140 as measured along the first direction X. In the present embodiment, the length L3 of the second electrode 140 is, for example, smaller than the length L4 of the second surface 132 of the sensing layer 130. However, the disclosure is not limited thereto. A difference between the length L3 of the second electrode 140 and the length L4 of the second surface 132 of the sensing layer 130 is, for example, between 0.1 μm and 10 μm. However, the disclosure is not limited thereto. In the present embodiment, when the length L3 of the second electrode 140 is smaller than the length L4 of the second surface 132 of the sensing layer 130, leakage current in the sensing unit 100 can be reduced.

In a schematic top view of the present embodiment (as shown in FIG. 1A), the area of the sensing layer 130 is greater than the area of the second electrode 140. In a schematic cross-sectional view of the present embodiment (as shown in FIG. 1B), an orthographic projection of the sensing layer 130 in the third direction Z is larger than an orthographic projection of the second electrode 140 in the third direction Z. In the present embodiment, a material of the second electrode 140 may be the same as the aforementioned material included in the first electrode 120, and the description thereof will not be repeated here. In the present embodiment, the material of the first electrode 120 and the material of the second electrode 140 may be different. However, the disclosure is not limited thereto. That is, in some embodiments, the material of the first electrode 120 and the material of the second electrode 140 may be the same according to needs.

In the present embodiment, an insulating layer 150 and/or an insulating layer 170 may further be included. The insulating layer 150 is disposed on the second electrode 140 to cover the substrate 110. In some embodiments, the insulating layer 150 may not be filled in the recess R or may be filled in part of the recess R, such that the insulating layer 150 has a distance from the side edge 121 (or side edge 122) of the first electrode 120 in the recess R. In some embodiments, the insulating layer 150 may completely fill the recess R, such that the insulating layer 150 is connected to the side edge 121 (or side edge 122) of the first electrode 120 in the recess R. The insulating layer 150 may have an opening 151 to expose part of the second electrode 140. In some embodiments, the insulating layer 150 may have a single-layer or multi-layer structure, and a material of the insulating layer 150 may be the same as the aforementioned material included in the insulating layer 113. The description thereof will not be repeated here.

In the present embodiment, a signal line 160 is disposed on the insulating layer 150. The signal line 160 may also be disposed in the opening 151 of the insulating layer 150, so as to be coupled to the second electrode 140 and provide a voltage signal. The insulating layer 170 is disposed on the signal line 160.

Referring to FIG. 2 and FIG. 3A to FIG. 3F together, a manufacturing method of the first electrode 120, the sensing layer 130, and the second electrode 140 of the sensing unit 100 in the sensing device 10 of the present embodiment will be described below.

Figure 3A:
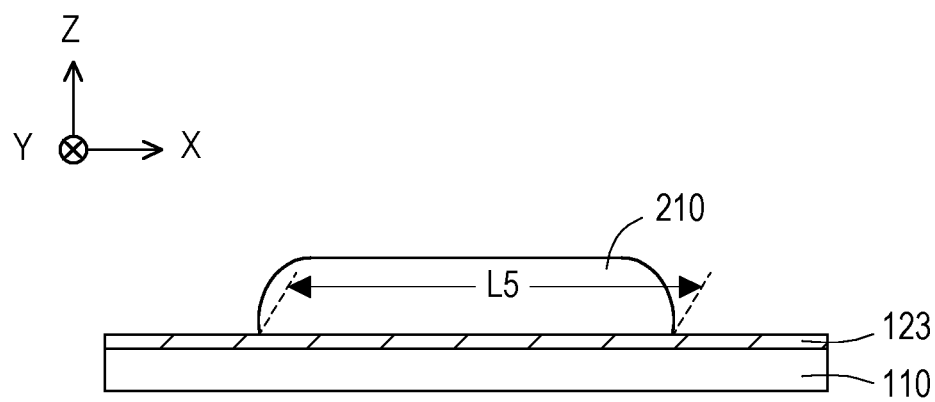
FIG. 3A to FIG. 3F are schematic cross-sectional views of a manufacturing method of a sensing device according to an embodiment of the disclosure.

First of all, referring to FIG. 2 and FIG. 3A, after the substrate 110 is provided, step S110 is performed in which a first electrode material 123 is formed on the substrate 110. Next, step S120 is performed, in which a first photoresist pattern 210 is formed on the first electrode material 123, so that the first photoresist pattern 210 covers a portion of the first electrode material 123 and exposes another portion of the first electrode material 123. The first photoresist pattern 210 has a length L5, and the length L5 is, for example, a maximum length of the first photoresist pattern 210 as measured along the first direction X.

Figure 3B:
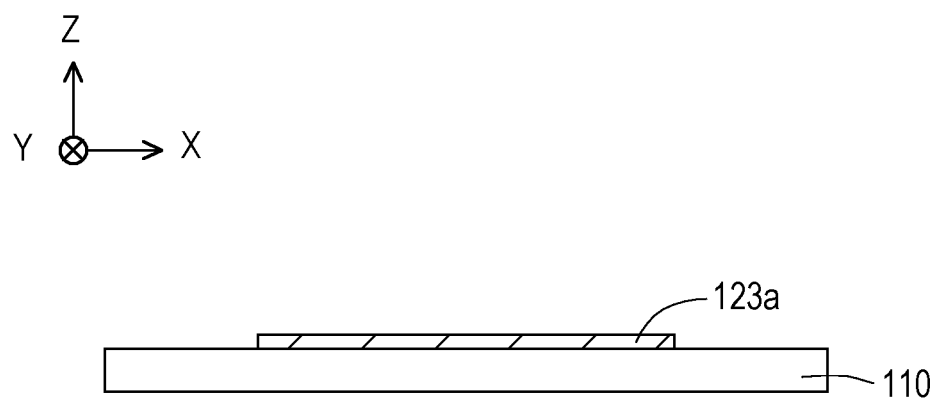

Next, referring to FIG. 2 and FIG. 3B, step S130 is performed, in which wet etching is performed on the first electrode material 123, so as to remove the another portion of the first electrode material 123 exposed by the first photoresist pattern 210, and to form a first electrode material pattern 123a. Next, after the first electrode material pattern 123a is formed, the first photoresist pattern 210 is removed.

Figure 3C:
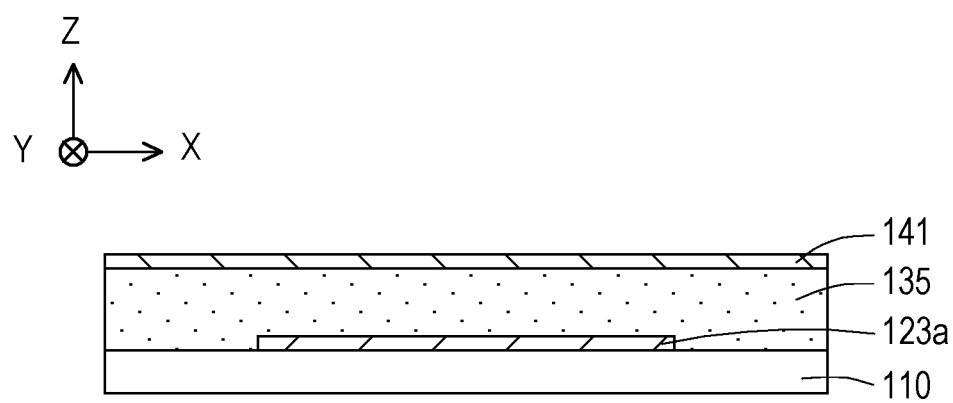

Next, referring to FIG. 2 and FIG. 3C, step S140 is performed, in which a sensing material 135 and a second electrode material 141 are sequentially formed on the substrate 110, so that the sensing material 135 covers the first electrode material pattern 123a and the substrate 110, and the second electrode material 141 covers the sensing material 135.

Figure 3D:
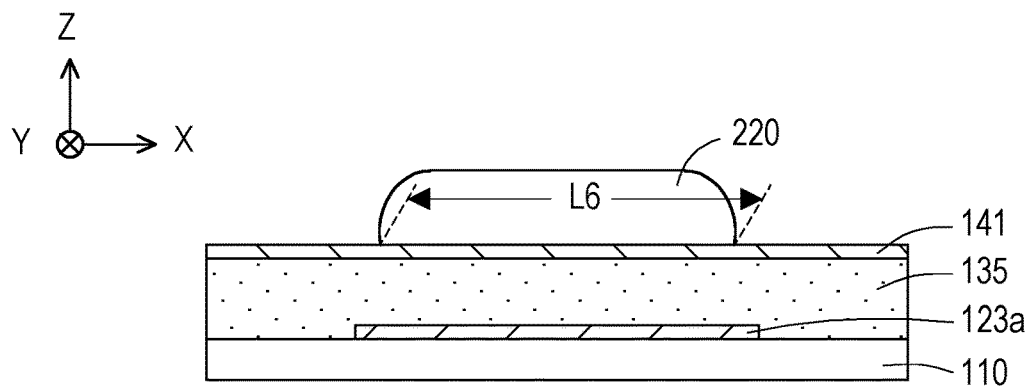

Next, referring to FIG. 2 and FIG. 3D, step S150 is performed, in which a second photoresist pattern 220 is formed on the second electrode material 141, so that the second photoresist pattern 220 covers a portion of the second electrode material 141 and exposes another portion of the second electrode material 141. The second photoresist pattern 220 has a length L6, and the length L6 is, for example, a maximum length of the second photoresist pattern 220 as measured along the first direction X. In the present embodiment, the length L5 of the first photoresist pattern 210 is, for example, greater than the length L6 of the second photoresist pattern 220. However, the disclosure is not limited thereto.

Figure 3E:
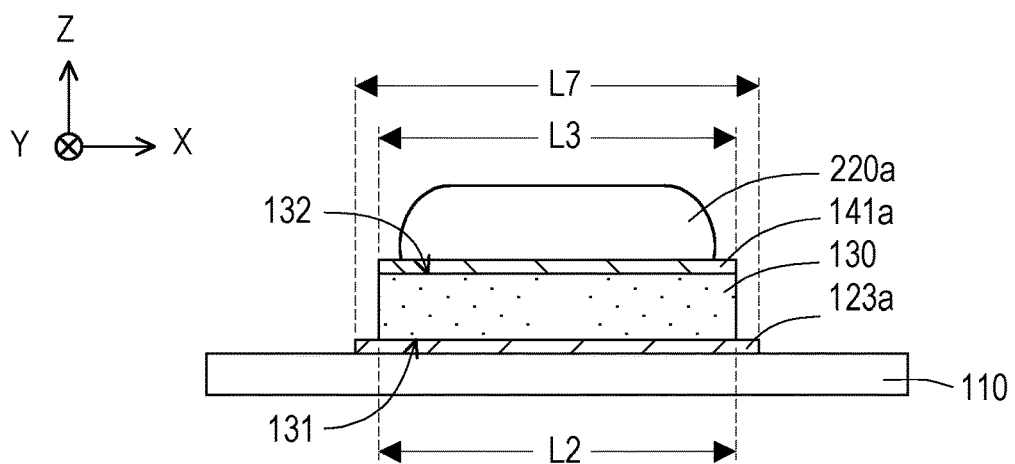

Next, referring to FIG. 2 and FIG. 3E, step S160 is performed, in which wet etching is performed on the second electrode material 141, so as to remove the another portion of the second electrode material 141 exposed by the second photoresist pattern 220, and to form a second electrode material pattern 141a (that is, second electrode). At this time, the second photoresist pattern 220 and the second electrode material pattern 141a may cover a portion of the sensing material 135 and expose another portion of the sensing material 135. Next, step S170 is performed, in which dry etching is performed on the sensing material 135, so as to remove the another portion of the sensing material 135 exposed by the second electrode material pattern 141a, and to form the sensing layer 130 (that is, the sensing layer 130 is formed later than the second electrode). In the present embodiment, the dry etching in step S170 may remove part of the second photoresist pattern 220 and form a third photoresist pattern 220a that is relatively small. In the present embodiment, since the length L5 of the first photoresist pattern 210 is greater than the length L6 of the second photoresist pattern 220, a length L7 of the first electrode material pattern 123a is greater than the length L2 of the first surface 131 of the sensing layer 130 and the length L3 of the second electrode material pattern 141a. The length L7 is, for example, a maximum length of the first electrode material pattern 123a as measured along the first direction X. In the present embodiment, the length L4 of the second surface 132 of the sensing layer 130 may be substantially equal to the length L3 of the second electrode material pattern 141a. However, the disclosure is not limited thereto.

Figure 3F:
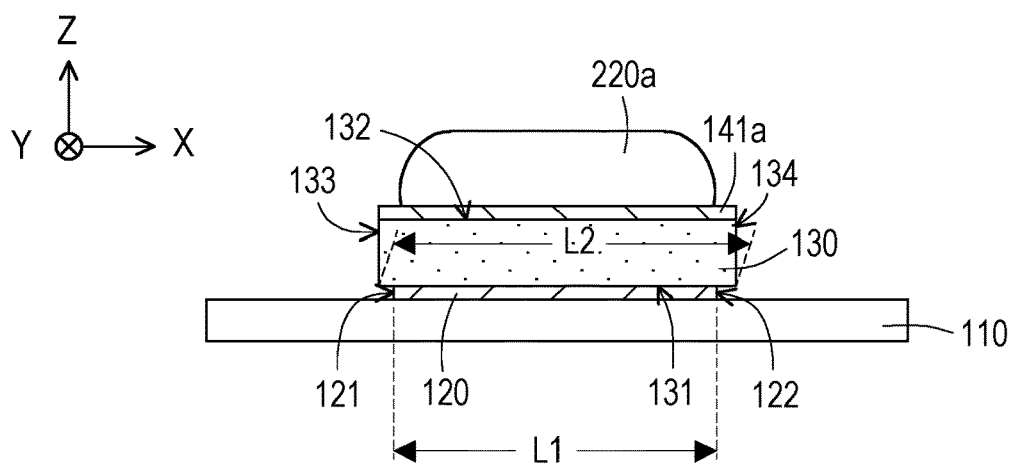

Finally, referring to FIG. 2 and FIG. 3F, step S180 is performed. After the sensing layer 130 is formed on the substrate 110, wet etching may be performed on the first electrode material pattern 123a with a selected etching solution, so as to form the first electrode 120 (that is, the first electrode 120 is formed later than the sensing layer 130, and the first electrode 120 is formed later than the second electrode). The length L1 of the first electrode 120 is smaller than the length L2 of the first surface 131 of the sensing layer 130, and the side edge 121 (or side edge 122) of the first electrode 120 is not flush with the first side edge 133 (or second side edge 134) of the sensing layer 130. The side edge 121 (or side edge 122) of the first electrode 120 may be retracted to directly below the sensing layer 130, so that the sensing layer 130, the first electrode 120, and the substrate 110 define the recess R. The two side edges of the recess R may respectively be the first surface 131 of the sensing layer 130 and the surface of the substrate 110 facing the sensing layer 130, and the bottom surface of the recess R may be the side edge 121 or the side edge 122 of the first electrode 120. Therefore, compared to FIG. 3E in which the length L7 of the first electrode material pattern 123a is greater than the length L2 of the first surface 131 of the sensing layer 130, in FIG. 3F, since the length L1 of the first electrode 120 may be smaller than the length L2 of the first surface 131 of the sensing layer 130, parasitic capacitance can be reduced or electronic noise can be reduced. After that, the third photoresist pattern 220a is removed to form the second electrode 140, thereby completing the manufacture of the sensing unit 100 of the present embodiment.

In the manufacturing method of the sensing device 10 of the present embodiment, the first electrode material pattern 123a is firstly fabricated using the first photoresist pattern 210, then the second electrode material pattern 141a and the sensing layer 130 are fabricated on the first electrode material pattern 123a using the second photoresist pattern 220, and finally, the first electrode material pattern 123a is patterned by wet etching to form the first electrode 120. However, the disclosure does not impose any limitations on the manufacturing method of the sensing device 10, as long as the sensing layer 130 that has a smaller length than the first electrode material pattern 123a is firstly formed on the first electrode material pattern 123a and the first electrode material pattern 123a is then etched into the first electrode 120 that has a smaller length than the length L2 of the first surface 131 of the sensing layer 130.

In the present embodiment, since a material of the second electrode material 141 may be different from a material of the first electrode material 123, an etching solution that does not perform wet etching on the second electrode material 141 and the first electrode material 123 at the same time may be selected to only etch the first electrode material pattern 123a into the first electrode 120 in step S180. However, the disclosure is not limited thereto. That is, in some embodiments, when the material of the second electrode material 141 is the same as the material of the first electrode material 123, the selected etching solution may wet-etch the second electrode material pattern 141a and the first electrode material pattern 123a at the same time. Thud, in step S180, the length L3 of the second electrode material pattern 141a after wet etching may be smaller than the length L4 of the second surface 132 of the sensing layer 130, as shown in FIG. 1D.

Other embodiments are described below. It is to be noted that, in the following embodiments, the reference numerals and part of the content of the foregoing embodiments are applied, in which the same reference numerals denote the same or similar components, and description of the same technical content is omitted. The omitted content will be understood by reference to the foregoing embodiments, and will not be repeated.

FIG. 4A to FIG. 4D are schematic cross-sectional views of a manufacturing method of a sensing device according to another embodiment of the disclosure. The embodiment shown in FIG. 4A to FIG. 4D is similar to the embodiment shown in FIG. 3A to FIG. 3F. Therefore, the same elements are denoted by the same reference numerals, and the details thereof will not be repeated. A difference between the embodiment shown in FIG. 4A to FIG. 4D and the embodiment shown in FIG. 3A to FIG. 3F is as follows. In the manufacturing method of the present embodiment, the first electrode material 123, the sensing material 135, and the second electrode material 141 are firstly formed; next, the second electrode material 141 and the sensing material 135 are sequentially etched to form the second electrode material pattern 141a and the sensing layer 130; finally, the first electrode material 123 is etched to form the first electrode 120.

Figure 4A:
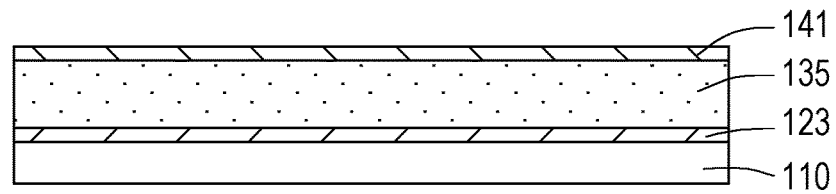
FIG. 4A to FIG. 4D are schematic cross-sectional views of a manufacturing method of a sensing device according to another embodiment of the disclosure.

Specifically, referring to FIG. 4A, after the substrate 110 is provided, the first electrode material 123, the sensing material 135, and the second electrode material 141 are sequentially formed on the substrate 110.

Figure 4B:
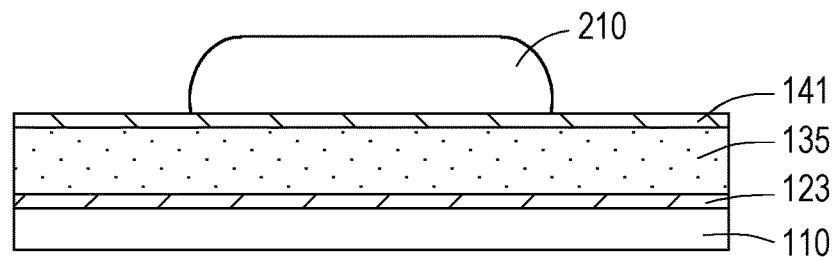

Next, referring to FIG. 4B, the first photoresist pattern 210 is formed on the second electrode material 141, so that the first photoresist pattern 210 covers a portion of the second electrode material 141 and exposes another portion of the second electrode material 141.

Figure 4C:
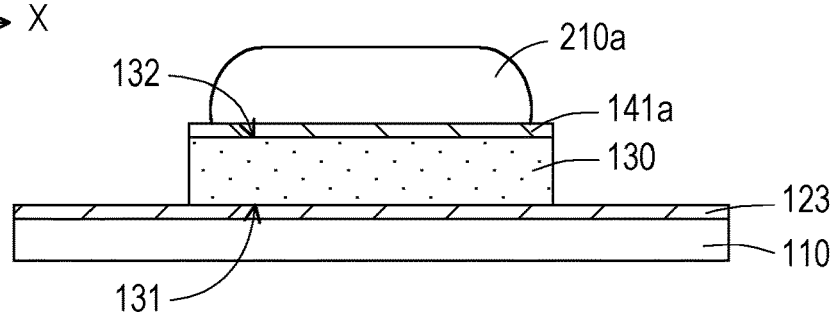

Next, referring to FIG. 4C, wet etching is firstly performed on the second electrode material 141, so as to remove the another portion of the second electrode material 141 exposed by the first photoresist pattern 210, and to form the second electrode material pattern 141a. At this time, in the state in which the first photoresist pattern 210 is not removed, the first photoresist pattern 210 and the second electrode material pattern 141a may cover a portion of the sensing material 135 and expose another portion of the sensing material 135. Next, dry etching is performed on the sensing material 135, so as to remove the another portion of the sensing material 135 exposed by the second electrode material pattern 141a, and to form the sensing layer 130. At this time, the dry etching described above may remove part of the first photoresist pattern 210 to form a fourth photoresist pattern 210a that is relatively small.

Figure 4D:
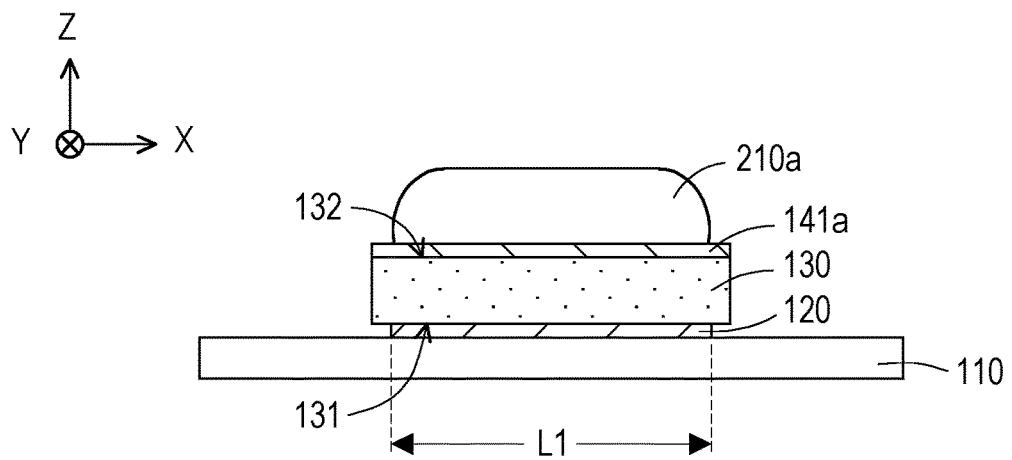

Finally, referring to FIG. 4D, in the state in which the sensing layer 130 has been formed on the substrate 110 and the fourth photoresist pattern 210a is not removed, wet etching is performed on the first electrode material 123 with an etching solution to form the first electrode 120. After that, the fourth photoresist pattern 210a is removed, thereby completing the manufacture of the sensing unit 100 of the present embodiment.

In the present embodiment, since the material of the second electrode material 141 is different from the material of the first electrode material 123, an etching solution may be selected to only etch the first electrode material 123 into the first electrode 120 in step S180. However, the disclosure is not limited thereto. That is, in some embodiments, when the material of the second electrode material 141 is the same as the material of the first electrode material 123, the selected etching solution may wet-etch the second electrode material pattern 141a and the first electrode material 123 at the same time, so that, after wet etching, the length L3 of the second electrode 140 is smaller than the length L4 of the second surface 132 of the sensing layer 130, and the length L1 of the first electrode 120 is smaller than the length L2 of the first surface 131 of the sensing layer 130, as shown in FIG. 1D.

FIG. 5A to FIG. 5G are schematic cross-sectional views of a manufacturing method of a sensing device according to another embodiment of the disclosure. The embodiment shown in FIG. 5A to FIG. 5G is similar to the embodiment shown in FIG. 3A to FIG. 3F. Therefore, the same elements are denoted by the same reference numerals, and the details thereof will not be repeated. A difference between the embodiment shown in FIG. 5A to FIG. 5G and the embodiment shown in FIG. 3A to FIG. 3F is as follows. In the manufacturing method of the present embodiment, the first electrode material 123 is firstly formed and is etched to form the first electrode material pattern 123a; next, the sensing material 135 is formed and is etched to form the sensing layer 130; next, the second electrode material 141 is formed and is etched to form the second electrode material pattern 141a; finally, the first electrode material pattern 123a is etched to form the first electrode 120.

Figure 5A:
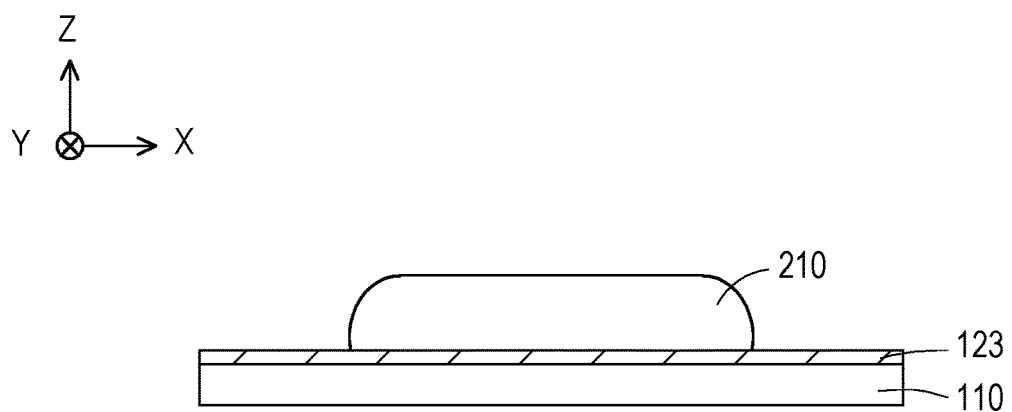
FIG. 5A to FIG. 5G are schematic cross-sectional views of a manufacturing method of a sensing device according to another embodiment of the disclosure.
Figure 5B:
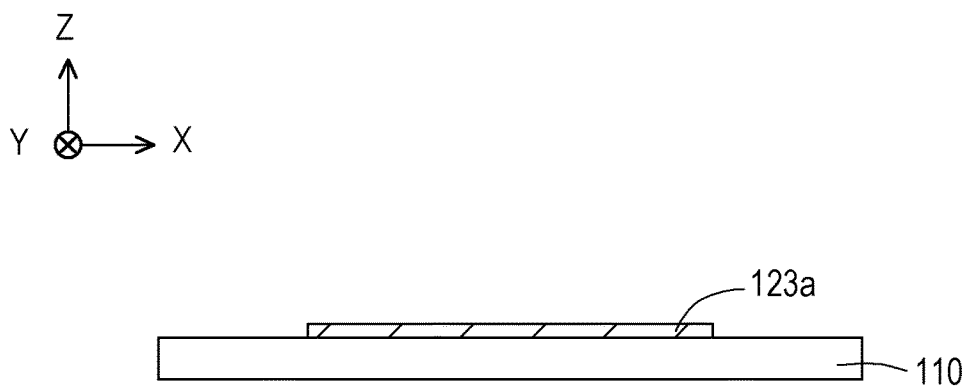

Specifically, referring to FIG. 5A and FIG. 5B, after the substrate 110 is provided, the first electrode material 123 is formed on the substrate 110. Next, the first photoresist pattern 210 is formed on the first electrode material 123. Next, wet etching is performed on the first electrode material 123 to form the first electrode material pattern 123a. Next, the first photoresist pattern 210 is removed.

Figure 5C:
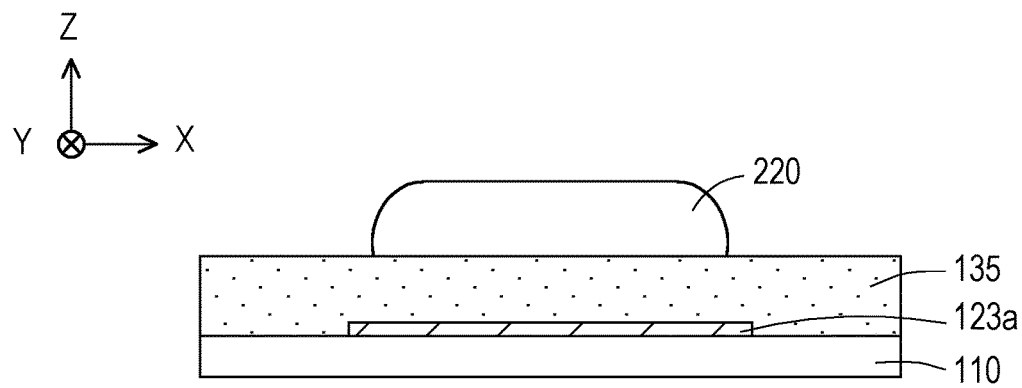
Figure 5D:
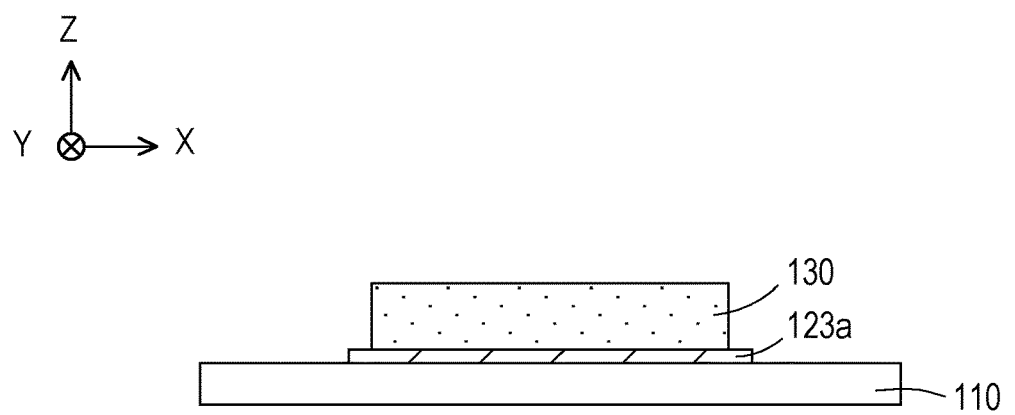

Next, referring to FIG. 5C and FIG. 5D, the sensing material 135 is formed on the first electrode material pattern 123a, so that the sensing material 135 covers the substrate 110 and the first electrode material pattern 123a. Next, the second photoresist pattern 220 is formed on the sensing material 135, and dry etching is performed on the sensing material 135 to form the sensing layer 130. Next, the second photoresist pattern 220 is removed.

Figure 5E:
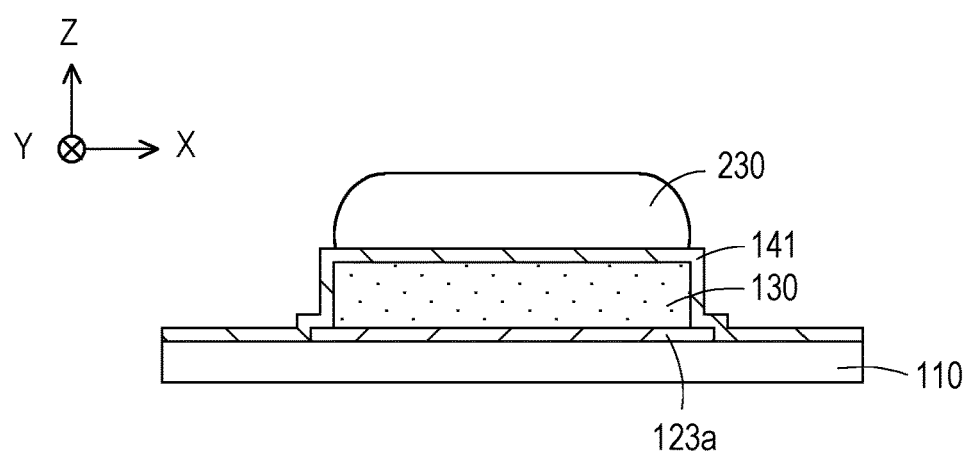
Figure 5F:
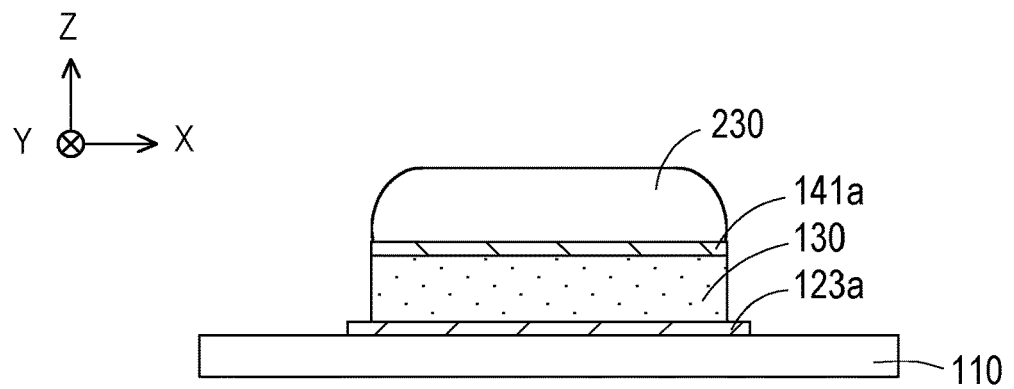

Next, referring to FIG. 5E and FIG. 5F, the second electrode material 141 is formed on the sensing layer 130, so that the second electrode material 141 covers the substrate 110, the first electrode material pattern 123a, and the sensing layer 130. Next, a fifth photoresist pattern 230 is formed on the second electrode material 141, and wet etching is performed on the second electrode material 141 to form the second electrode material pattern 141a.

Figure 5G:
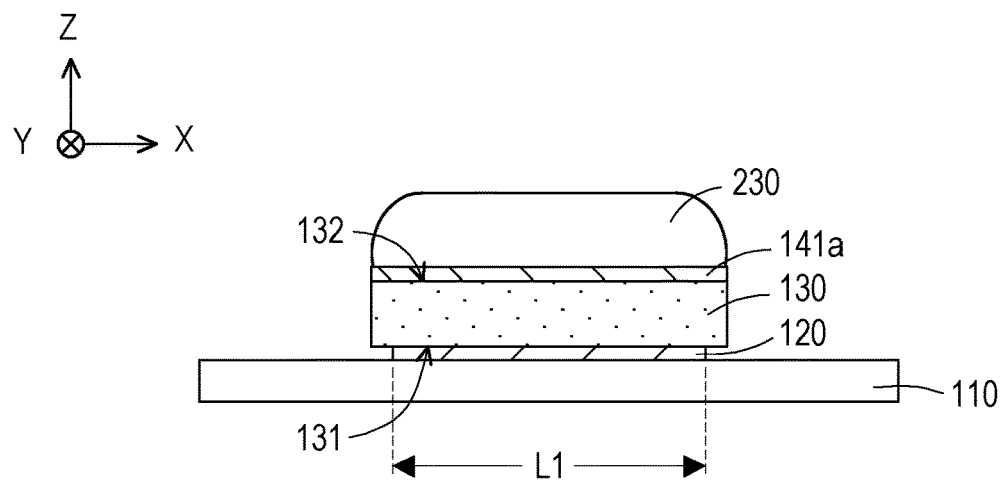

Finally, referring to FIG. 5G, in the state in which the second electrode material pattern 141a has been formed on the substrate 110 and the fifth photoresist pattern 230 is not removed, wet etching may be performed on the first electrode material pattern 123a with a selected etching solution, so as to form the first electrode 120. After that, the fifth photoresist pattern 230 is removed, thereby completing the manufacture of the sensing unit 100 of the present embodiment.

In the present embodiment, since the material of the second electrode material 141 is different from the material of the first electrode material 123, an etching solution may be selected to only etch the first electrode material pattern 123a into the first electrode 120 in step S180. However, the disclosure is not limited thereto. That is, in some embodiments, when the material of the second electrode material 141 is the same as the material of the first electrode material 123, the selected etching solution may wet-etch the second electrode material pattern 141a and the first electrode material pattern 123a at the same time, so that, after wet etching, the length L3 of the second electrode 140 is smaller than the length L4 of the second surface 132 of the sensing layer 130, and the length L1 of the first electrode 120 is smaller than the length L2 of the first surface 131 of the sensing layer 130, as shown in FIG. 1D.

FIG. 6A to FIG. 6F are schematic cross-sectional views of a manufacturing method of a sensing device according to another embodiment of the disclosure. The embodiment shown in FIG. 6A to FIG. 6F is similar to the embodiment shown in FIG. 3A to FIG. 3F. Therefore, the same elements are denoted by the same reference numerals, and the details thereof will not be repeated. A difference between the embodiment shown in FIG. 6A to FIG. 6F and the embodiment shown in FIG. 3A to FIG. 3F is as follows. In the manufacturing method of the present embodiment, the first electrode material 123 and the sensing material 135 are firstly formed; next, the sensing material 135 is etched to form the sensing layer 130; next, the second electrode material 141 is formed and is etched to form the second electrode 140; finally, the first electrode material 123 is etched to form the first electrode 120.

Figure 6A:
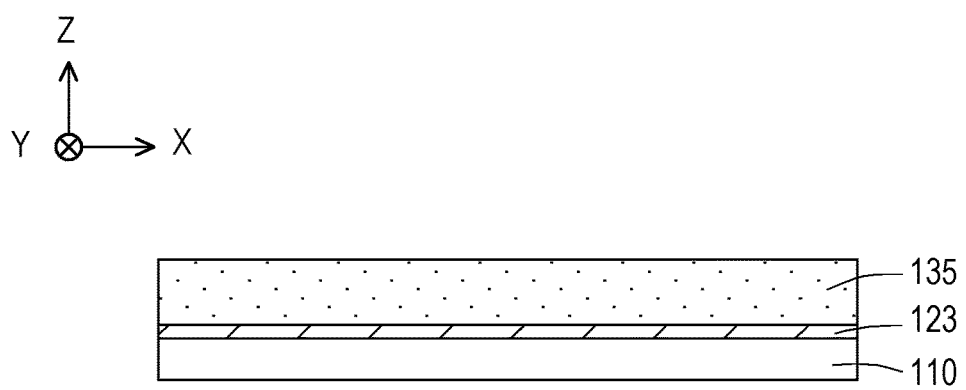
FIG. 6A to FIG. 6F are schematic cross-sectional views of a manufacturing method of a sensing device according to another embodiment of the disclosure.

Specifically, referring to FIG. 6A, after the substrate 110 is provided, the first electrode material 123 and the sensing material 135 are sequentially formed on the substrate 110.

Figure 6B:
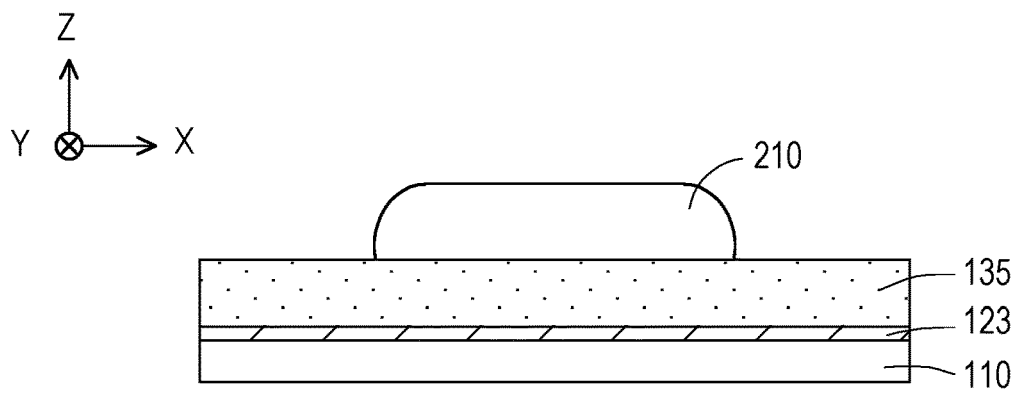
Figure 6C:
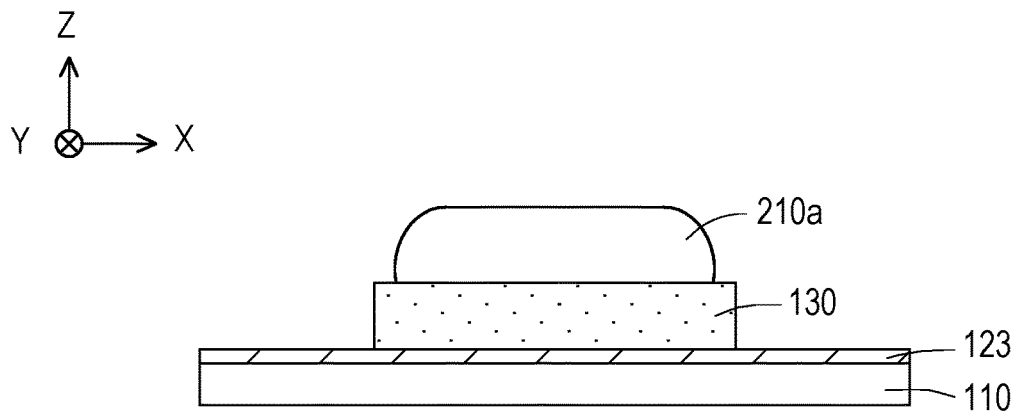

Next, referring to FIG. 6B and FIG. 6C, the first photoresist pattern 210 is formed on the sensing material 135; next, dry etching is performed on the sensing material 135 to form the sensing layer 130. At this time, the dry etching described above may remove part of the first photoresist pattern 210 to form the fourth photoresist pattern 210a that is relatively small.

Figure 6D:
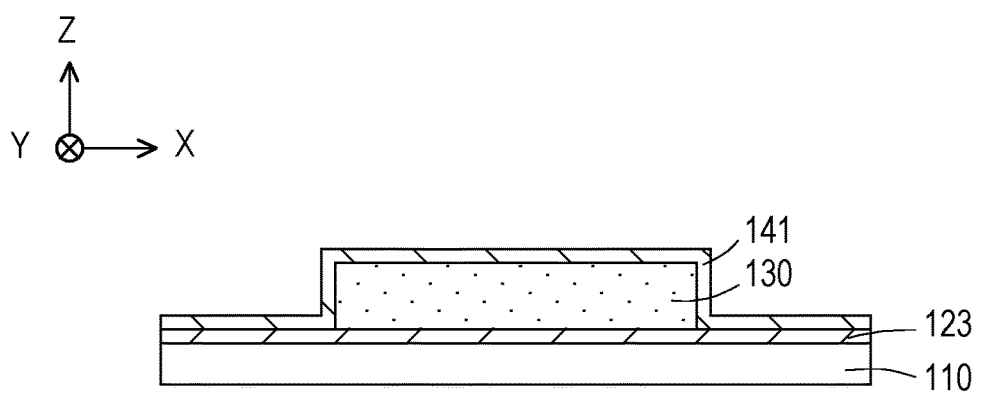
Figure 6E:
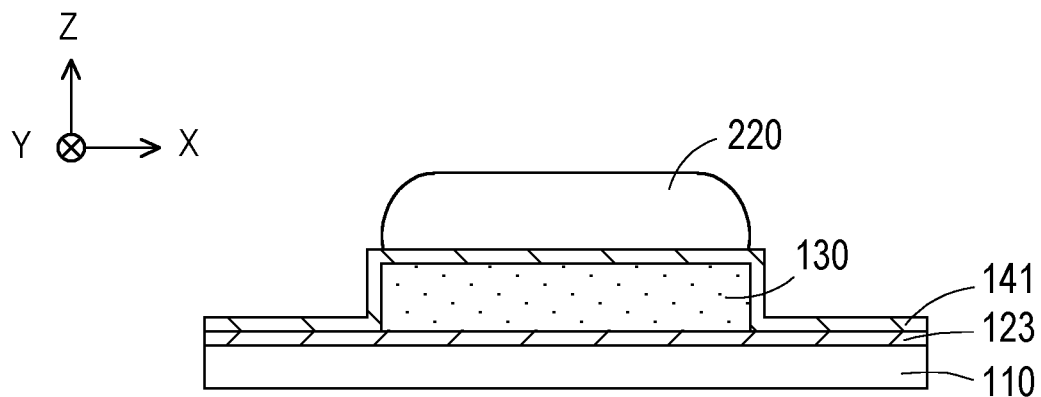
Figure 6F:
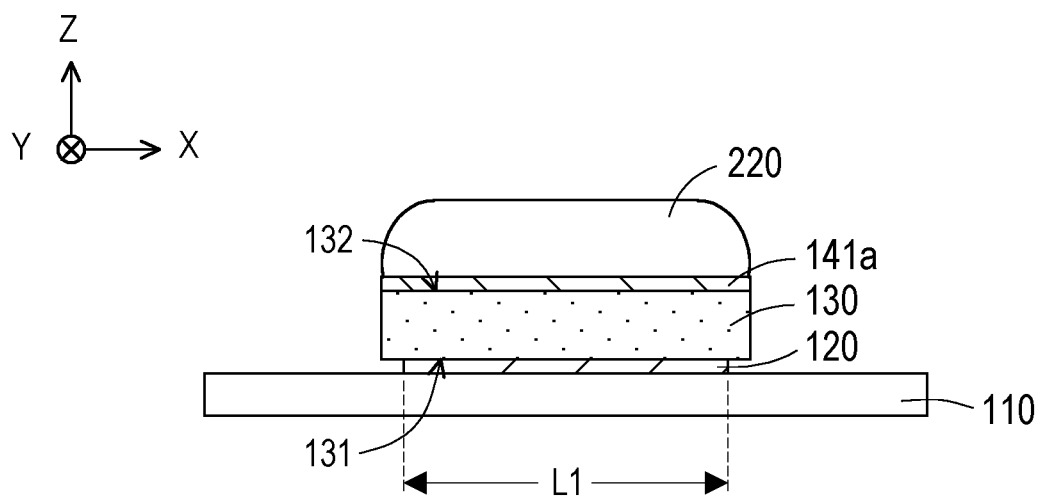

Next, referring to FIG. 6D and FIG. 6E, after the fourth photoresist pattern 210a is removed, the second electrode material 141 is formed on the sensing layer 130, so that the second electrode material 141 covers the first electrode material 123 and the sensing layer 130. Next, the second photoresist pattern 220 is formed on the second electrode material 141; referring then to FIG. 6F, wet etching is performed on the second electrode material 141 to form the second electrode material pattern 141a. Next, in the state in which the second photoresist pattern 220 is not removed, wet etching is performed on the first electrode material 123 with an etching solution to form the first electrode 120. After that, the second photoresist pattern 220 is removed, thereby completing the manufacture of the sensing unit 100 of the present embodiment.

In the present embodiment, since the material of the second electrode material 141 is different from the material of the first electrode material 123, an etching solution may be selected to only etch the first electrode material 123 into the first electrode 120 in step S180. However, the disclosure is not limited thereto. That is, in some embodiments, when the material of the second electrode material 141 is the same as the material of the first electrode material 123, the selected etching solution may wet-etch the second electrode material 141 and the first electrode material 123 at the same time, so that, after wet etching, the length L3 of the second electrode 140 is smaller than the length L4 of the second surface 132 of the sensing layer 130, and the length L1 of the first electrode 120 is smaller than the length L2 of the first surface 131 of the sensing layer 130, as shown in FIG. 1D.

In summary, in the sensing device and the manufacturing method thereof according to the embodiments of the disclosure, by making the length of the first electrode smaller than the length of the first surface of the sensing layer (or making the area of the first electrode smaller than the area of the sensing layer), while light sensing sensitivity of the sensing device is improved, a distance can be provided between the first electrode and the source (or data line) or scan line, such that parasitic capacitance can be reduced or electronic noise can be reduced in the sensing device and the manufacturing method thereof according to the embodiments of the disclosure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A sensing device comprising:
   a substrate;
   a first electrode disposed on the substrate;
   a sensing layer disposed on the first electrode and having a first surface adjacent to the first electrode; and
   a second electrode disposed on the sensing layer,
   wherein the first electrode has a length smaller than a length of the first surface of the sensing layer,
   wherein the sensing layer has a second surface adjacent to the second electrode, and the second electrode has a length smaller than a length of the second surface.

2. The sensing device according to claim 1, wherein a difference between the length of the first electrode and the length of the first surface is between 0.1 µm and 10 µm.

3. The sensing device according to claim 1, wherein a material of the first electrode is different from a material of the second electrode.

4. The sensing device according to claim 1, wherein a material of the first electrode is the same as a material of the second electrode.

5. The sensing device according to claim 1, wherein area of the sensing layer is greater than area of the first electrode.

6. The sensing device according to claim 1, wherein the substrate comprises:
   a base; and
   a transistor disposed on the base and comprising a source, wherein a distance is provided between the first electrode and the source.

7. The sensing device according to claim 1, wherein a distance is provided between a first side edge of the sensing layer and a side edge of the first electrode.

8. The sensing device according to claim 7, wherein the distance is between 0.1 µm and 5 µm.

9. A manufacturing method of a sensing device, comprising:
   providing a substrate;
   forming a sensing layer on the substrate;
   forming a first electrode on the substrate so that the first electrode is disposed between the sensing layer and the substrate; and
   forming a second electrode on the sensing layer,
   wherein the sensing layer has a first surface adjacent to the first electrode, and the first electrode has a length smaller than a length of the first surface of the sensing layer,
   wherein the sensing layer has a second surface adjacent to the second electrode, and the second electrode has a length smaller than a length of the second surface.

10. The manufacturing method of a sensing device according to claim 9, wherein the first electrode is formed later than the sensing layer.

11. The manufacturing method of a sensing device according to claim 9, wherein the sensing layer is formed later than the second electrode.

12. The manufacturing method of a sensing device according to claim 11, wherein a material of the first electrode is the same as a material of the second electrode.

13. The manufacturing method of a sensing device according to claim 11, wherein a material of the first electrode is different from a material of the second electrode.

14. The manufacturing method of a sensing device according to claim 9, wherein the first electrode is formed later than the second electrode.

15. The manufacturing method of a sensing device according to claim 9, wherein area of the sensing layer is greater than area of the first electrode.

16. The manufacturing method of a sensing device according to claim 9, wherein the substrate comprises:
   a base; and
   a transistor disposed on the base and comprising a source, wherein a distance is provided between the first electrode and the source.

17. The manufacturing method of a sensing device according to claim 9, wherein a distance is provided between a first side edge of the sensing layer and a side edge of the first electrode, and the distance is between 0.1 μm and 5 μm.

\* \* \* \* \*